(12) United States Patent
Lin et al.

(10) Patent No.: US 6,835,989 B2
(45) Date of Patent: Dec. 28, 2004

(54) METHODS TO FORM DUAL METAL GATES BY INCORPORATING METALS AND THEIR CONDUCTIVE OXIDES

(75) Inventors: Wenhe Lin, Singapore (SG); Mei-Sheng Zhou, Singapore (SG); Kin Leong Pey, Singapore (SG); Simon Chooi, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/736,943

(22) Filed: Dec. 16, 2003

(65) Prior Publication Data

US 2004/0132239 A1 Jul. 8, 2004

Related U.S. Application Data

(62) Division of application No. 10/227,697, filed on Aug. 26, 2002, now Pat. No. 6,677,652, which is a division of application No. 09/981,416, filed on Oct. 18, 2001, now Pat. No. 6,458,695.

(51) Int. Cl.$^7$ ............................................. H01L 29/76
(52) U.S. Cl. ..................... 257/407; 257/338; 257/357; 438/199
(58) Field of Search .................. 257/407, 338, 257/357, 369, 371; 438/199, 230

(56) References Cited

U.S. PATENT DOCUMENTS

| | | | |
|---|---|---|---|
| 5,266,519 A | 11/1993 | Iwamoto | 437/183 |
| 6,043,157 A | 3/2000 | Gardner et al. | 438/692 |
| 6,083,836 A | 7/2000 | Rodder | 438/690 |
| 6,087,231 A | 7/2000 | Xiang et al. | 438/287 |
| 6,475,908 B1 | 11/2002 | Lin et al. | 438/659 |
| 6,750,519 B2 * | 6/2004 | Lin et al. | 257/407 |

* cited by examiner

Primary Examiner—Jack Chen
(74) Attorney, Agent, or Firm—George O. Saile; Rosemary L. S. Pike

(57) ABSTRACT

Methods for forming dual-metal gate CMOS transistors are described. An NMOS and a PMOS active area of a semiconductor substrate are separated by isolation regions. A metal layer is deposited over a gate dielectric layer in each active area. Oxygen ions are implanted into the metal layer in one active area to form an implanted metal layer which is oxidized to form a metal oxide layer. Thereafter, the metal layer and the metal oxide layer are patterned to form a metal gate in one active area and a metal oxide gate in the other active area wherein the active area having the gate with the higher work function is the PMOS active area. Alternatively, both gates may be metal oxide gates wherein the oxide concentrations of the two gates differ. Alternatively, a dummy gate may be formed in each of the active areas and covered with a dielectric layer. The dielectric layer is planarized thereby exposing the dummy gates. The dummy gates are removed leaving gate openings to the semiconductor substrate. A metal layer is deposited over a gate dielectric layer within the gate openings to form metal gates. One or both of the gates are oxygen implanted and oxidized. The PMOS gate has the higher work function.

4 Claims, 7 Drawing Sheets

METHODS TO FORM DUAL METAL GATES BY INCORPORATING METALS AND THEIR CONDUCTIVE OXIDES

RELATED PATENT APPLICATION

This is a division of patent application Ser. No. 10/227,697, filing date Aug. 26, 2002, now U.S. Pat. No. 6,677,652, which is a divisional of Ser. No. 09/981,416 filed on Oct. 18, 2001, now U.S. Pat. No. 6,458,695. Methods To Form Dual Metal Gates By Incorporating Metals And Their Conductive Oxides, assigned to the same assignee as the present invention.

BACKGROUND OF THE INVENTION (1) Field of the Invention

The present invention relates to the fabrication of integrated circuit devices, and more particularly, to a method of fabricating dual-metal transistors having different work functions in the fabrication of integrated circuits.

(2) Description of the Prior Art

It is anticipated that a single metal gate with mid-gap work function values will not be suitable for CMOS applications due to buried channel effects. By using a single metal gate for both NMOSFET and PMOSFET, the threshold voltage becomes too high for both types of transistors. In order to achieve a lower threshold voltage, additional implantation is required and this will result in buried channel effects. The short channel effect control will then be degraded. However, with dual metal gates having different work functions, additional implantation is not required. That is, one electrode with a lower work function will be used in the NMOSFET while another electrode with a higher work function will be used for the PMOSFET. That means that the threshold voltage for NMOSFET and PMOSFET can be tailored independently. It is desired to maintain the conventional CMOS process flow in the dual metal gate process.

U.S. Pat. No. 6,043,157 to Gardner et al shows a process for forming dual gates where one gate is polysilicon and the other gate is metal. U.S. Pat. No. 6,087,231 to Xiang et al discloses a dummy gate process where amorphous gates doped with different dopants are formed. U.S. Pat. No. 6,083,836 to Rodder teaches a dummy gate process where two gates are formed. For example, one gate is polysilicon and the other is aluminum. U.S. Pat. No. 5,266,519 to Iwamoto teaches oxidation of a metal film to be used as an anti-plating mask.

SUMMARY OF THE INVENTION

Accordingly, a primary object of the invention is to provide a process for forming dual metal gates for CMOS transistors in the fabrication of integrated circuits.

A further object of the invention is to provide a process for forming dual-metal gate CMOS transistors having different work functions in the fabrication of integrated circuits.

Another object of the invention is to provide a process for forming dual-metal gate CMOS transistors where one gate comprises a metal and the other gate comprises the metal's oxide.

Yet another object of the invention is to provide a process for forming dual-metal gate CMOS transistors comprising a metal and the metal oxide.

A still further object of the invention is to provide a process for forming dual-metal gate CMOS transistors comprising a first metal oxide and a second metal oxide wherein the metal is the same in both gates and the oxide concentration is different.

In accordance with the objects of the invention, a method for forming dual-metal gate CMOS transistors is achieved. First and second active areas of a semiconductor substrate are separated by isolation regions. One of the active areas will be PMOS and the other will be NMOS. A gate dielectric layer is formed overlying the semiconductor substrate in each of the active areas. A metal layer is deposited overlying the gate dielectric layer. Oxygen ions are implanted into the metal layer in a first area to form an implanted metal layer and the implanted metal layer is oxidized to form a metal oxide layer. Thereafter, the metal layer and the metal oxide layer are patterned to form a metal gate in a second area and a metal oxide gate in the first area to complete formation of dual-metal gate CMOS transistors in the fabrication of an integrated circuit. The metal oxide may have a higher or lower work function depending on the metal used. The PMOS gate will be formed from the gate having the higher work function.

Also, in accordance with the objects of the invention, a second method for forming dual-metal gate CMOS transistors is achieved. First and second active areas of a semiconductor substrate are separated by isolation regions. One of the active areas will be PMOS and the other will be NMOS. A dummy gate is formed in each of the active areas. The dummy gates are covered with a dielectric layer which is planarized whereby a top surface of each of the dummy gates is exposed. The exposed dummy gates are removed, leaving gate openings to the semiconductor substrate. A gate dielectric layer is formed overlying the semiconductor substrate in each of the gate openings. A metal layer is deposited within the gate openings to form metal gates. Oxygen ions are implanted into the metal gate only in a first area to form an implanted metal gate. The implanted metal gate is oxidized to form a metal oxide gate in the second area to complete formation of dual-metal gate CMOS transistors in the fabrication of an integrated circuit. The metal oxide may have a higher or lower work function depending on the metal used. The PMOS gate will be formed from the gate having the higher work function.

Also, in accordance with the objects of the invention, a third method for forming dual-metal gate CMOS transistors is achieved. First and second active areas of a semiconductor substrate are separated by isolation regions. One of the active areas will be PMOS and the other will be NMOS. A gate dielectric layer is formed overlying the semiconductor substrate in each of the active areas. A metal layer is deposited overlying the gate dielectric layer. First oxygen ions are implanted into the metal layer in a first area to form an implanted metal layer and the implanted metal layer is oxidized to form a first metal oxide layer. Second oxygen ions are implanted into the metal layer in the second area to form an implanted metal layer and the implanted metal layer is oxidized to form a second metal oxide layer wherein the oxygen concentration in the second metal oxide layer is different from the oxide concentration in the first metal oxide layer. Thereafter, the first metal oxide layer and the second metal oxide layer are patterned to form a first metal oxide gate in the first area and a second metal oxide gate in the second area to complete formation of dual-metal gate CMOS transistors in the fabrication of an integrated circuit. The PMOS gate will be formed from the gate having the higher work function.

Also, in accordance with the objects of the invention, a fourth method for forming dual-metal gate CMOS transistors is achieved. First and second active areas of a semiconductor substrate are separated by isolation regions. One of the active areas will be PMOS and the other will be NMOS. A dummy gate is formed in each of the active areas. The dummy gates are covered with a dielectric layer which is planarized whereby a top surface of each of the dummy gates is exposed. The exposed dummy gates are removed, leaving gate openings to the semiconductor substrate. A gate dielectric layer is formed overlying the semiconductor substrate in each of the gate openings. A metal layer is deposited within the gate openings to form metal gates. First oxygen ions are implanted into the metal gate only in a first area to form an implanted metal gate. The implanted metal gate is oxidized to form a first metal oxide gate in the second area. Second oxygen ions are implanted into the metal gate in the second area to form an implanted metal gate and the implanted metal gate is oxidized to form a second metal oxide gate wherein the oxygen concentration in the second metal oxide gate is different from the oxide concentration in the first metal oxide gate to complete formation of dual-metal gate CMOS transistors in the fabrication of an integrated circuit. The PMOS gate will be formed from the gate having the higher work function.

Also, in accordance with the objects of the invention, a dual-metal gate CMOS integrated circuit device is achieved. The device comprises first and second active areas of a semiconductor substrate separated by isolation regions. One of the active areas will be PMOS and the other will be NMOS. A metal gate in a first area overlies a gate dielectric layer, and a metal oxide gate in the second area overlies a gate dielectric layer wherein the metal in the metal gate is the same material as the metal in the metal oxide gate. The metal oxide may have a higher or lower work function depending on the metal used. The PMOS gate will be formed from the gate having the higher work function.

Also, in accordance with the objects of the invention, another dual-metal gate CMOS integrated circuit device is achieved. The device comprises first and second active areas of a semiconductor substrate separated by isolation regions. One of the active areas will be PMOS and the other will be NMOS. A first metal oxide gate in a first area overlies a gate dielectric layer, and a second metal oxide gate in the second area overlies a gate dielectric layer wherein the metal in the two gates is the same metal and the oxide concentration is different in each of the two gates. The PMOS gate will be formed from the gate having the higher work function.

BRIEF DESCRIPTION OF THE DRAWINGS

In the accompanying drawings forming a material part of this description, there is shown.

DESCRIPTION OF THE PREFERRED EMBODIMENTS

The present invention uses a metal and its metal oxide to form dual-metal gates having different work functions. In one embodiment, two different oxides of the metal are used as the dual-metal gates. It will be understood by those skilled in the art that the invention should not be limited to the embodiments described herein, but can be extended and applied to any application in which it is desired to have metal gates having differing work functions. The first embodiment of the invention will be described with reference to FIGS. 1–5. The second embodiment of the invention will be described with reference to FIGS. 6–11. The third embodiment of the invention will be described with reference to FIGS. 12 and 13.

Figure 1:
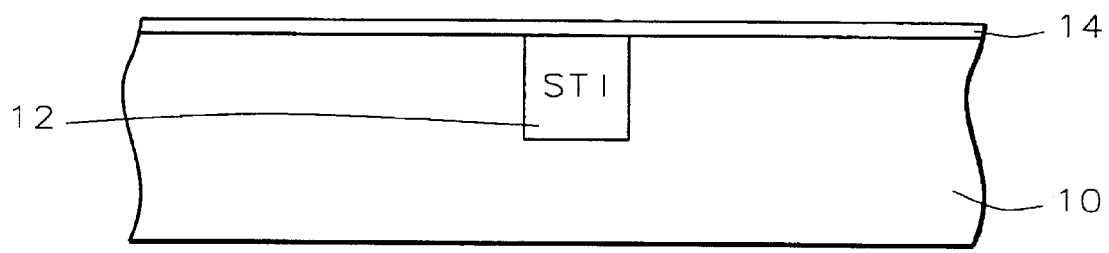
FIGS. 1 through 5 are cross-sectional representations of a first preferred embodiment of the present invention.

Referring now to FIGS. 1–5, the first preferred embodiment of the present invention will be described. Referring now more particularly to FIG. 1, there is shown a semiconductor substrate 10. This is preferably monocrystalline silicon. Isolation regions, such as shallow trench isolation (STI) 12, are formed in the substrate to separate active regions. N-wells and P-wells, not shown, may be formed within the substrate, as is conventional. Punchthrough and threshold voltage adjustment implantations, not shown, are made as is conventional in the art.

A gate dielectric layer 14 is grown or deposited over substrate to a thickness of between about 15 and 150 Angstroms. For example, the dielectric layer may be a low dielectric constant material such as silicon dioxide, nitrided silicon dioxide, silicon nitride, or their combinations. Alternatively, the dielectric layer may be a high dielectric constant gate dielectric material such as zirconium oxide, hafnium oxide, aluminum oxide, tantalum pentoxide, barium strontium titanates, and crystalline oxide.

Figure 2:
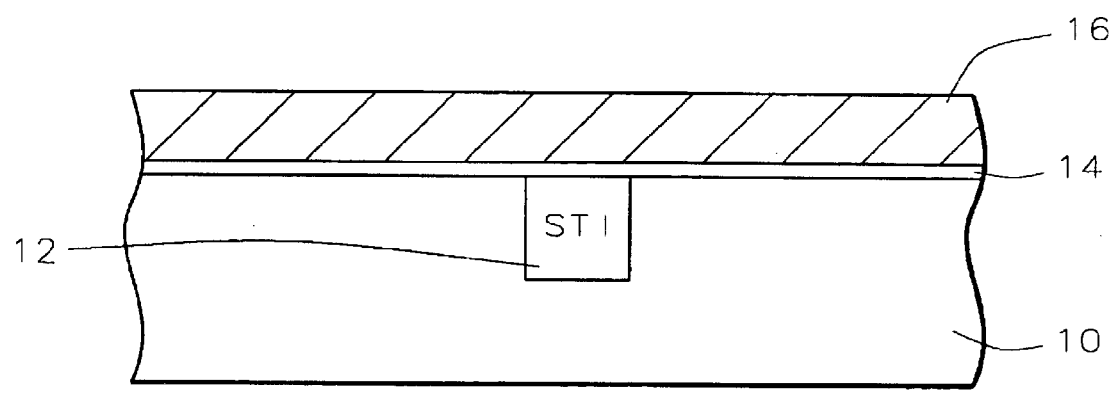

Referring now to FIG. 2, a metal layer 16 is formed over the gate dielectric layer to a thickness of between about 1000 and 4000 Angstroms. The metal layer 16 may be formed by sputtering, evaporation, chemical vapor deposition (CVD), or electroplating. The deposited metal can be ruthenium, iridium, osmium, rhodium, rhenium, or similar metals.

Figure 3:
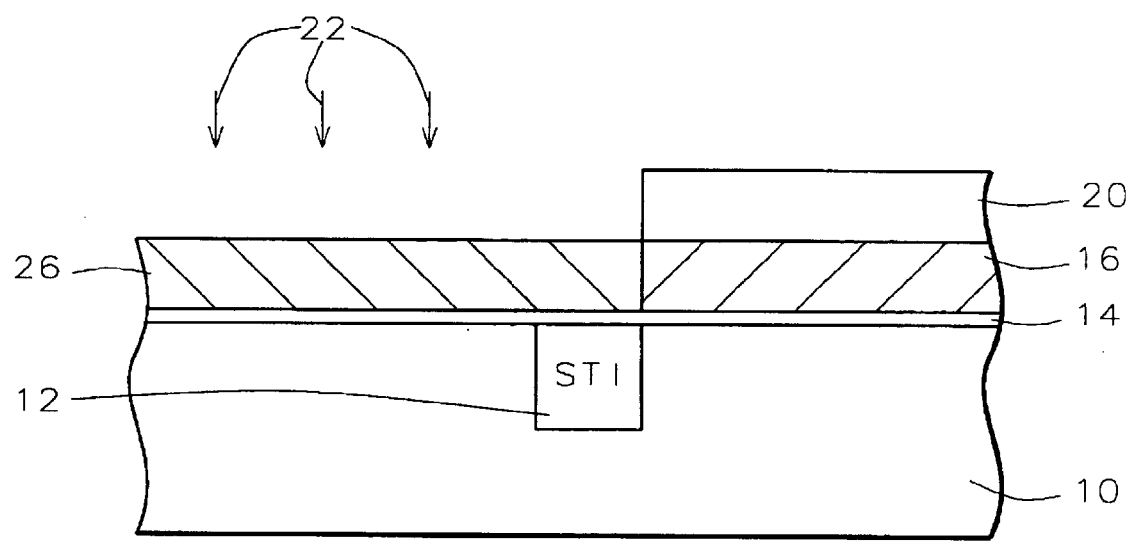

Now, the metal layer is masked, as shown in FIG. 3, to expose a region where the metal will be oxidized. The mask 20 may be a photoresist mask or a hard mask layer, depending upon the type of annealing to be performed. Oxidation may be accomplished by oxygen implantation into the exposed areas, followed by annealing in an inert gas or an oxygen ambient.

As shown in FIG. 3, oxygen ions are implanted 22 into the metal layer 16 where it is not covered by the mask 20. Oxygen ions are implanted with a dosage of between about 5 E 15 to 5 E 17 ions/cm$^2$ and an energy of between about 1 to 50 KeV. It is important that the masking layer is thick enough to protect the underlying metal layer from implantation. Annealing can be performed in a furnace, rapid thermal process (RTP), or a laser system. The photomask must be removed prior to annealing in an inert gas. However, if the annealing is performed in an oxygen ambient, a hard mask should be used to protect the metal layer from oxidation. Oxidation can also be achieved by plasma assisted oxidation of the exposed region such as by remote plasma oxidation. Oxidized metal region 26 is the result of the oxidation process.

Figure 4:
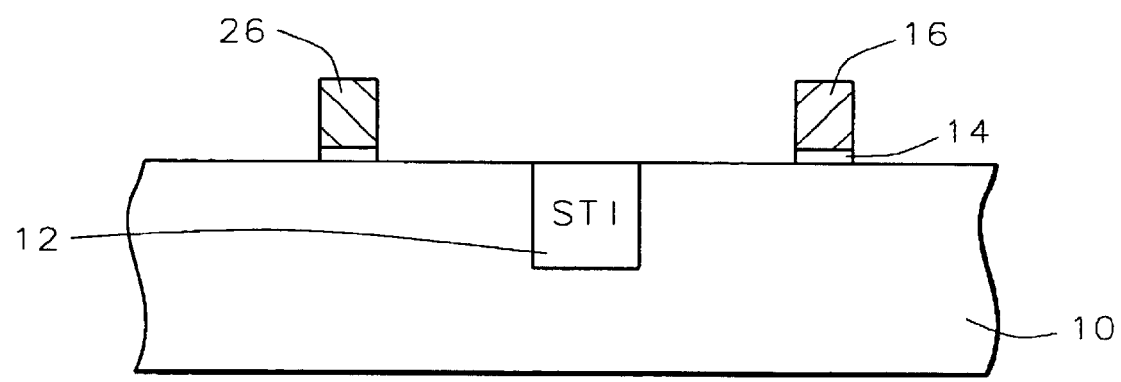

Referring now to FIG. 4, the metal and metal oxide layers, 16 and 26, respectively, are patterned to form gate electrodes. A chemical mechanical polishing (CMP) process may be applied to achieve planarization. In one embodiment, the metal oxide 26 is patterned to form the first gate electrode and, subsequently, the metal layer is patterned to form the second gate electrode. In another embodiment, both gate electrodes are defined and etched at the same time. The etching can be achieved by alternating chemistry 1 and chemistry 2 with time and using a high selectivity etch chemistry when the etch process is getting close to the end point, with chemistry 1 having a higher etch rate for the metal oxide, and chemistry 2 having a higher etch rate for the metal, or vice versa. Thus, metal gates 16 and 26, having different work functions, are realized.

The metal oxide gate 26 may have a higher or lower work function than the metal gate 16 depending on the metal used. The PMOS gate will be the gate having the higher work function and the NMOS gate will be the gate having the lower work function.

Figure 5:
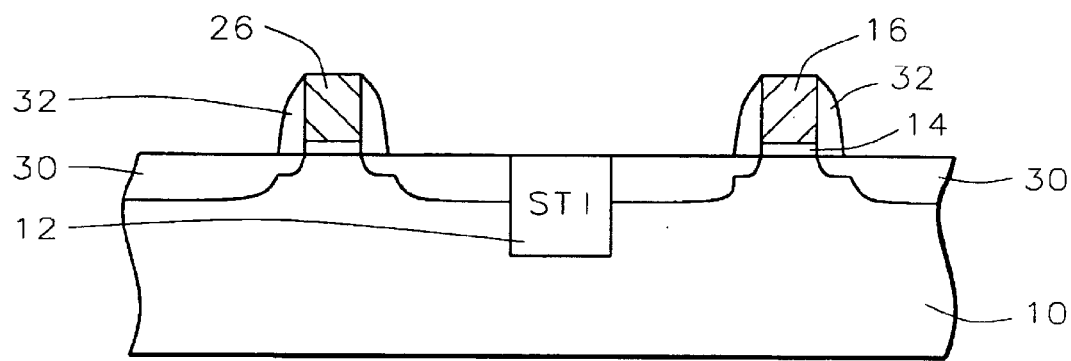

Referring now to FIG. 5, source/drain regions 30 and sidewall spacers 32 may be formed, as is conventional. The spacers 32 may comprise either silicon nitride or silicon oxide. Processing continues as is conventional in the art, except that silicidation over the gates is not required.

Figure 6:
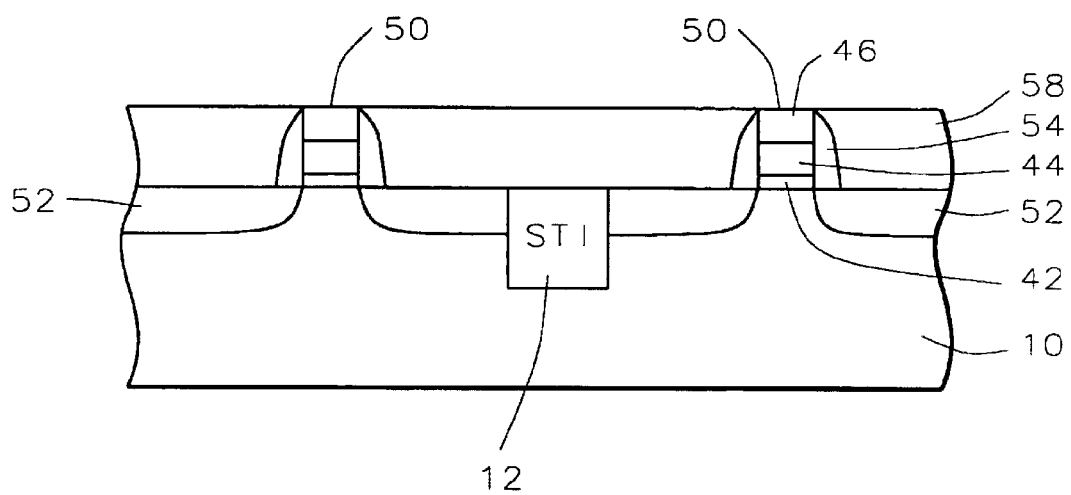
FIGS. 6 through 11 are cross-sectional representations of a second preferred embodiment of the present invention.

The second preferred embodiment of the present invention will be described with reference to FIGS. 6–11. This embodiment is a damascene gate process. Referring now more particularly to FIG. 6, there is shown a semiconductor substrate 10. This is preferably monocrystalline silicon. Isolation regions, such as shallow trench isolation (STI) 12, are formed in the substrate to separate active regions. N-wells and P-wells, not shown, may be formed within the substrate, as is conventional. Punchthrough and threshold voltage adjustment implantations, not shown, are made as is conventional in the art.

Dummy gates are formed. A first layer of silicon oxide 42 is deposited over the substrate to a thickness of between about 15 and 50 Angstroms. A layer of silicon nitride 44 is deposited over the silicon oxide layer 42 to a thickness of between about 15 and 200 Angstroms. A layer of polysilicon 46 is deposited over the silicon nitride layer 44 to a thickness of between about 500 and 3000 Angstroms. The dummy gate stack is patterned to form a dummy gate 50 in each of the active areas, as shown in FIG. 6. Sidewall spacers 54 and source/drain regions 52 are formed as is conventional in the art. Now, an interlevel dielectric layer 58 is deposited over the dummy gates and planarized to the top of the dummy gates by CMP.

Figure 7:
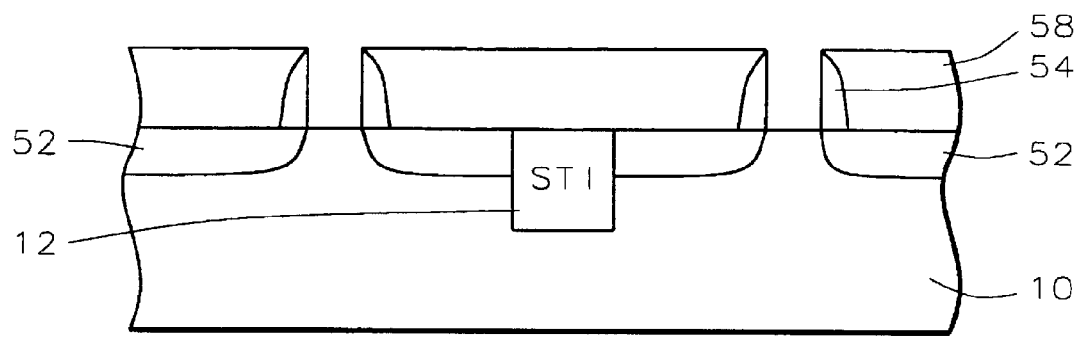

As shown in FIG. 7, the dummy gates 50 are removed where they are exposed by the CMP process. The dummy gates are removed by wet etching, dry etching, or a combination of the two.

Figure 8:
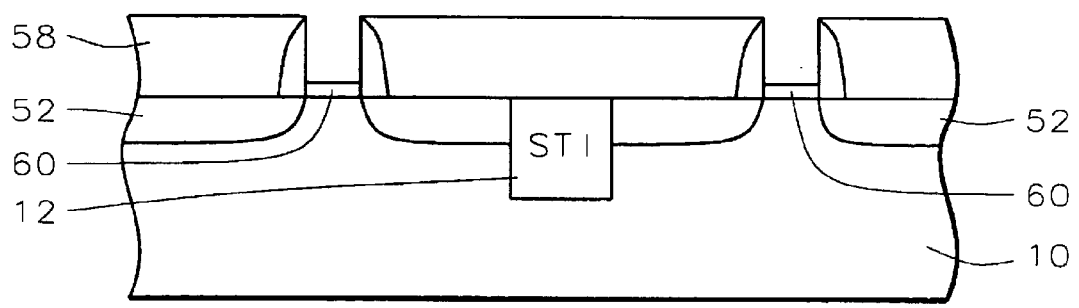

Now, the dual-metal gates of the present invention are to be formed. A gate dielectric layer 60 is deposited or thermally grown on the exposed substrate surface within the dummy gate openings to a thickness of between about 15 and 150 Angstroms, as shown in FIG. 8. As in the first embodiment, the dielectric layer may be a low dielectric constant material such as silicon dioxide, nitrided silicon dioxide, silicon nitride, or their combinations or a high dielectric constant gate dielectric material such as zirconium oxide, hafnium oxide, aluminum oxide, tantalum pentoxide, barium strontium titanates, and crystalline oxide.

Figure 9:
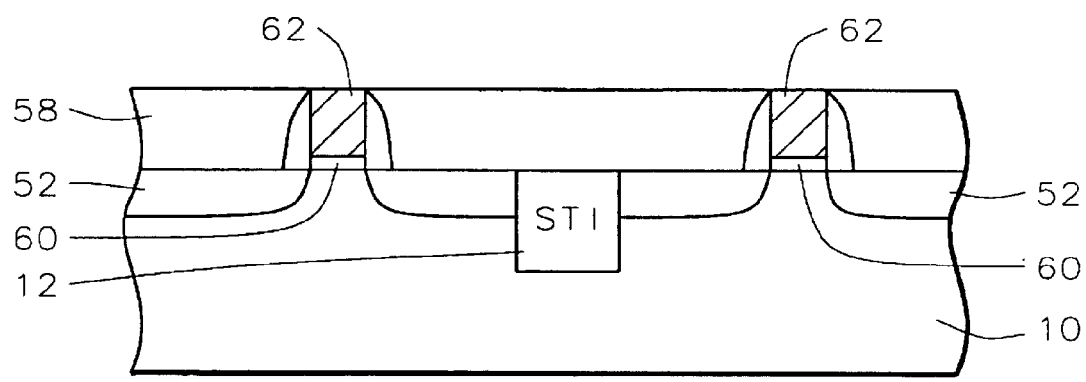

Referring now to FIG. 9, a metal layer 62 is formed over the gate dielectric layer 60. The metal layer 62 may be formed by sputtering, evaporation, chemical vapor deposition (CVD), or electroplating. The deposited metal can be ruthenium, iridium, osmium, rhodium, rhenium, or similar metals. A CMP process polishes away the metal layer not within the dummy gate openings, thus completing the damascene process.

Figure 10:
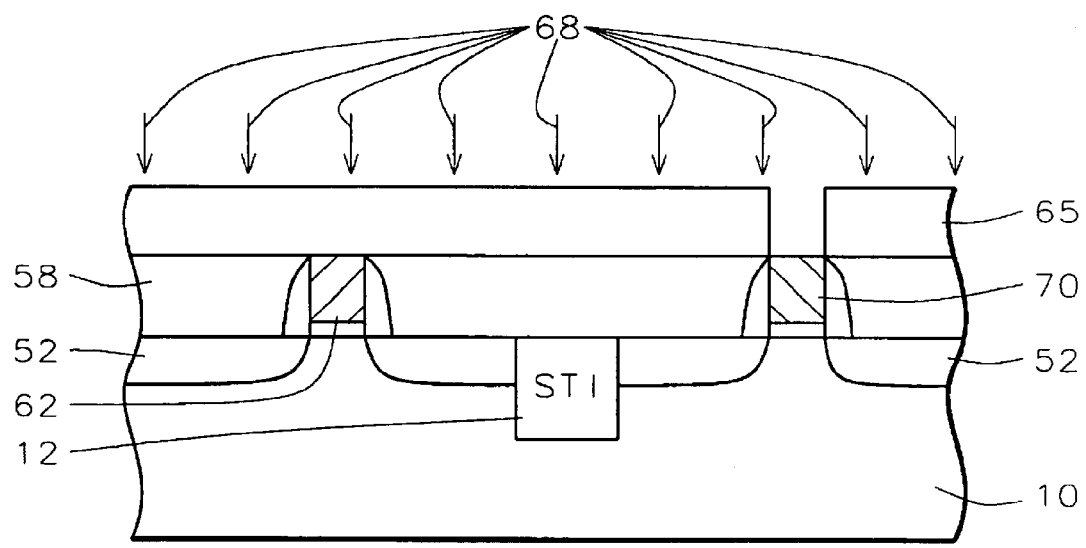

Now, as shown in FIG. 10, a photomask 65 is formed to cover the intermetal dielectric layer 58 and the first gate. An opening is formed in the photomask to expose only the second gate that is to be oxidized. Oxygen ions are implanted 68 into the second gate where it is not covered by the mask 65. Oxygen ions are implanted with a dosage of between about 5 E 15 to 5 E 17 ions/cm$^2$ and an energy of between about 1 to 50 KeV. It is important that the masking layer is thick enough to protect the first gate from implantation.

After stripping the photomask 65, an annealing step is performed to form an oxide from the oxygen-implanted metal 70. Alternatively, the oxidation can be achieved by exposing the second gate electrode to an oxidizing ambient. During the annealing or oxidizing step, the first gate electrode and the intermetal dielectric layer are protected by a hard mask such as silicon nitride.

Figure 11:
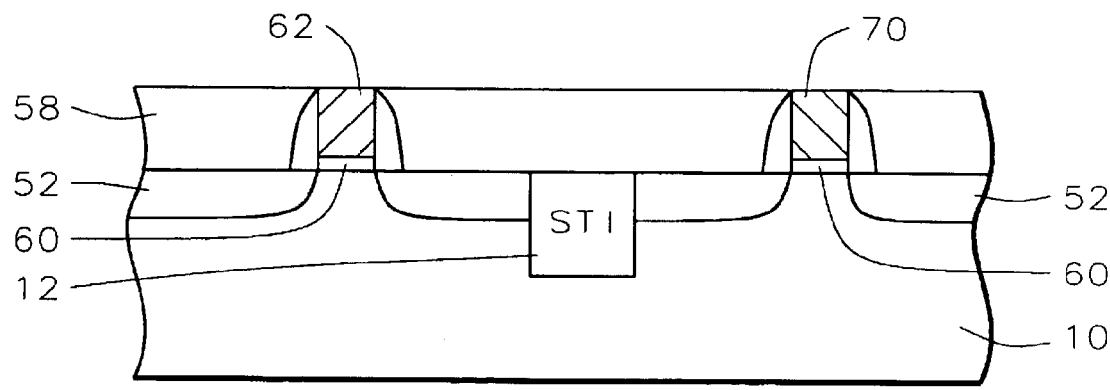

As shown in FIG. 11, metal gates 62 and 70, having different work functions, are realized. Gate 62 comprises a metal while gate 70 comprises metal oxide. The gate electrode with the higher work function will be the PMOSFET while the gate electrode with the lower work function will be the NMOSFET.

The work functions of the gate electrodes of the first two embodiments have been measured as shown in Table 1. Resistivity is also shown.

TABLE 1

| gate material | work func (eV) | resistivity ($\mu\Omega$/cm) |
| --- | --- | --- |
| Ru | 4.60–4.71 | 7.7 |
| RuO$_2$ | 4.9–5.2 | 45 |
| Ir | 5.0–5.7 | 5.3 |
| IrO$_2$ | N/A | <100 |
| Os | 4.7–4.83 | 9.5 |
| OsO$_2$ | N/A | <100 |
| Rh | 4.75–4.98 | 4.5 |
| RhO$_2$ | N/A | <100 |
| Re | N/A | <100 |
| ReO$_2$ | N/A | <100 |
| Polysilicon | | |
| P-type | ~5.1 | <1000 |
| N-type | ~4.3 | <1000 |

For example, if ruthenium is used, the NMOSFET will comprise the Ru gate and the PMOSFET will comprise the RuO$_2$ gate since the PMOSFET must have a higher work function than the NMOSFET.

The dual-metal gate can also be realized by adjusting the work function of the oxide since the work function of the conductive oxide is closely related to the stoichiometry. That is, one gate electrode will be in the form of MO$_X$ while the other gate oxide will be in the form of MO$_Y$, where M is a metal which can be ruthenium, iridium, osmium, rhodium, or rhenium, and X is not equal to Y. The value of X and Y can be well adjusted by the implantation dose. The methods described for the first and second embodiments can also be used in this third embodiment dual-gate process.

Figure 12:
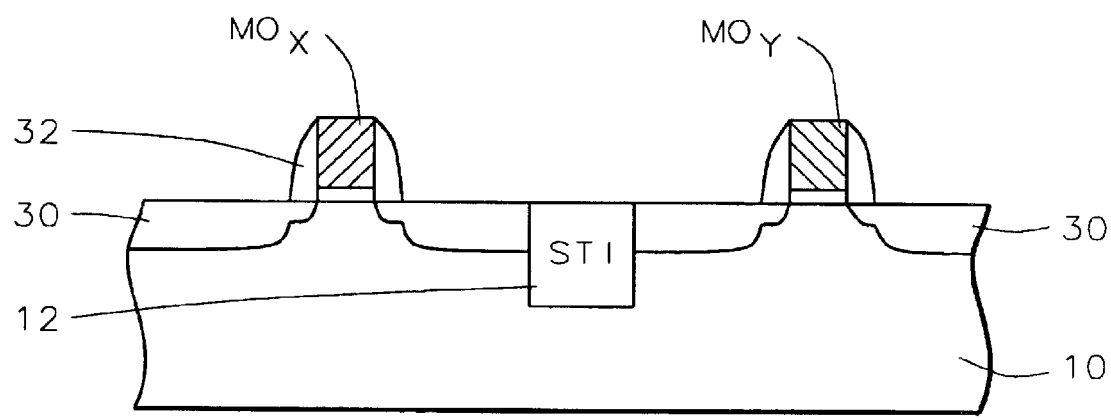
FIGS. 12 and 13 are cross-sectional representations of two alternatives of a third preferred embodiment of the present invention.

As shown in FIG. 12, the conventional gate formation process described in the first embodiment can be used to form the two gates MO$_X$ and MO$_Y$. The metal layer will be implanted with two different dosages of oxygen ions to form these two metal oxide gates having different work functions.

Figure 13:
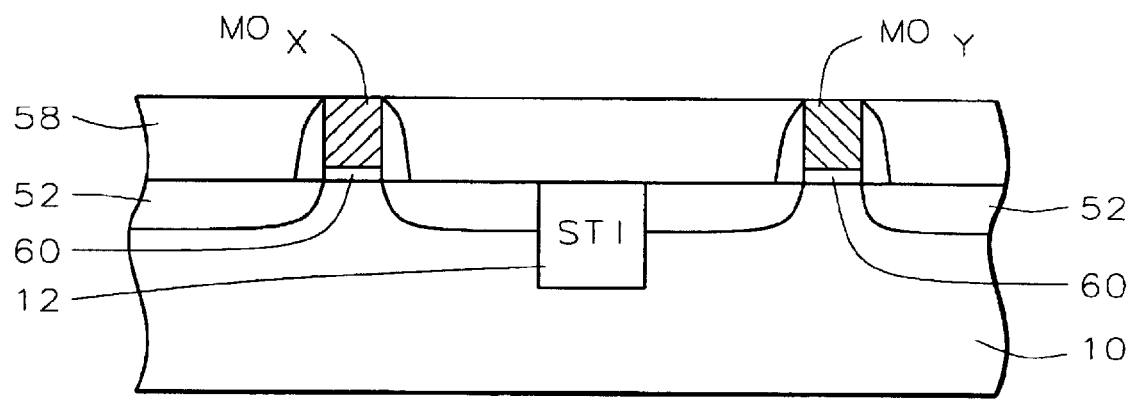

As shown in FIG. 13, the damascene gate process described in the second embodiment can be used to form the two gate MO$_X$ and MO$_Y$. The gates will each be implanted with different dosages of oxygen ions to form these two metal oxide gates having different work functions.

In both FIGS. 12 and 13, the gate having the higher work function will be the PMOSFET and the gate having the lower work function will be the NMOSFET.

The process of the present invention provides three simple, manufacturable dual-metal gate processes. The conventional CMOS process flow is maintained. The work function of the gates is simply tuned by the oxidation process. The dual-metal gates comprise a metal and a metal oxide, or two metal oxides having different work functions. The metal oxide having the higher work function will be used for the PMOS gate and the metal oxide having the lower work function will be used for the NMOS gate.

While the invention has been particularly shown and described with reference to the preferred embodiments thereof, it will be understood by those skilled in the art that various changes in form and details may be made without departing from the spirit and scope of the invention.

What is claimed is:

1. A dual-metal gate CMOS integrated circuit device comprising:

an NMOS active area and a PMOS active area of a semiconductor substrate separated by isolation regions;

a first metal oxide gate in said NMOS active area over a gate dielectric layer; and a second metal oxide gate in said PMOS active area over a gate dielectric layer wherein said metal in said first metal oxide gate is the same material as said metal in said second metal oxide gate and wherein the concentration of said oxide in said first metal oxide gate is different from said the concentration of said oxide in said second metal oxide gate and wherein said second metal oxide gate has a higher work function than said first metal oxide gate.

2. The device according to claim 1 wherein said gate dielectric layer comprises one of the group containing silicon dioxide, nitrided silicon dioxide, silicon nitride, and a combination thereof.

3. The device according to claim 1 wherein said gate dielectric layer comprises one of the group containing zirconium oxide, hafnium oxide, aluminum oxide, tantalum pentoxide, barium strontium titanates, and crystalline oxides.

4. The device according to claim 1 wherein said metal layer comprises one of the group containing ruthenium, iridium, osmium, rhodium, and rhenium.

* * * * *